(12) United States Patent
Jaiswal et al.

(10) Patent No.: US 7,384,855 B2
(45) Date of Patent: Jun. 10, 2008

(54) RESISTOR INTEGRATION STRUCTURE AND TECHNIQUE FOR NOISE ELIMINATION

(75) Inventors: Rajneesh Jaiswal, Tucson, AZ (US);
H. Jerome Barber, Tucson, AZ (US);
Thomas E. Kuehl, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 56 days.

(21) Appl. No.: 11/553,270

(22) Filed: Oct. 26, 2006

(65) Prior Publication Data
US 2007/0048960 A1 Mar. 1, 2007

Related U.S. Application Data

(62) Division of application No. 11/071,908, filed on Mar. 4, 2005, now Pat. No. 7,196,398.

(51) Int. Cl.
*H01L 21/20* (2006.01)
(52) U.S. Cl. ............... 438/384; 257/E51.003
(58) Field of Classification Search ............... 438/330, 438/384, 382, 381, 210, 238, 329; 257/E51.003, 257/E51.025
See application file for complete search history.

(56) References Cited

U.S. PATENT DOCUMENTS

| | | | |
|---|---|---|---|
| 5,420,063 A | | 5/1995 | Maghsoudnia et al. |
| 5,468,672 A | * | 11/1995 | Rosvold ............... 438/385 |
| 6,365,482 B1 | * | 4/2002 | Maghsoudnia ............... 438/384 |
| 2005/0122207 A1 | * | 6/2005 | Vialpando et al. ............... 338/309 |
| 2006/0040458 A1 | * | 2/2006 | Phan et al. ............... 438/382 |
| 2006/0166505 A1 | * | 7/2006 | Gasner et al. ............... 438/704 |

* cited by examiner

*Primary Examiner*—Thao P. Le
(74) *Attorney, Agent, or Firm*—Jacqueline J. Garner; W. James Brady, III; Frederick J. Telecky, Jr.

(57) ABSTRACT

A method of preventing contact noise in a SiCr thin film resistor includes performing in situ depositions of a SiCr layer and then a TiW layer on a substrate without breaking a vacuum between the depositions, to prevent formation of any discontinuous oxide between the SiCr layer and the TiW layer. The SiCr and TiW layers are patterned to form a predetermined SiCr thin film resistor pattern and a TiW resistor contact pattern on the SiCr thin film resistor, and a metallization layer is provided to contact the TiW forming the resistor contact pattern.

11 Claims, 3 Drawing Sheets

RESISTOR INTEGRATION STRUCTURE AND TECHNIQUE FOR NOISE ELIMINATION

This is a divisional application of Ser. No. 11/071,908 filed Mar. 4, 2005 now U.S. Pat. No. 7,196,398.

BACKGROUND OF THE INVENTION

The present invention relates generally to a new technique for providing inexpensive, low-noise integrated circuits, and more particularly to an improved technique for providing low noise SiCr thin film integrated circuit resistors without increasing integrated circuit processing costs.

FIG. 1 illustrates a conventional noise testing circuit arrangement 1 for measuring the amount of noise produced by a circuit, which in this case is low-noise integrated circuit operational amplifier 2 including thin film resistors. The (−) input of operational amplifier 2 is connected between the junction between a gain resistor R3 and a feedback resistor R4. The (+) input is coupled to ground by a switch 3 and a resistor R1. The output of operational amplifier 2 is connected to an oscilloscope 5 which is used to determine the noise signal on the output of operational amplifier 2.

SiCr (sichrome) thin film integrated circuit resistors are well known to have various advantages over NiCr thin-film integrated circuit resistors. For conventional NiCr (nichrome) resistors, aluminum interconnect metallization can be formed directly on the resistor contact areas. For manufacture of SiCr resistors, a TiW barrier layer ordinarily is provided between the SiCr contact areas and the aluminum metallization to prevent the aluminum from reacting with the silicon in SiCr.

It is well known that SiCr thin film resistors have certain advantages over standard NiCr thin film resistors. The sheet resistance of a deposited SiCr layer is much more stable than deposited NiCr layer. Consequently, the resistance of NiCr thin-film resistors undergoes substantial changes as further manufacturing steps are performed, especially during packaging of the integrated circuit chip. For example, the resistance of a typical NiCr thin-film resistor might change by several hundred parts per million between the time the NiCr layer is deposited on the wafer and the time at which the packaging of a chip of the wafer has been completed. In contrast, the corresponding change in resistance of a SiCr resistor might be only a few parts per million. It is also well known that SiCr thin film resistors maintain absolute values of the resistance, and therefore maintain nearly constant ratio matching (i.e., the ratio of the resistance of one resistor to the resistance of another resistor is nearly constant), which is far better than the ratio matching achieved by use of conventional NiCr thin film resistors.

The term "high-grade yield" is used to refer to a yield of an integrated circuit with respect to one or more particular parameters of the integrated circuit which are regarded as critical to its performance. For example, if the critical parameter of the integrated circuit does not shift by more than a specified amount over a particular amount of time or a particular sequence of manufacturing steps, the integrated circuit is considered to have a "high-grade yield" and therefore be a "high-grade chip". Otherwise, the integrated circuit is considered to have a "low-grade yield" and therefore to be a "low-grade chip".

SiCr thin film resistors generally have a substantially lower TCR (temperature coefficient of resistance) than NiCr thin film resistors. Generally, deposited NiCr oxidizes, and the process is somewhat uncontrolled because the oxidation of the NiCr causes its sheet resistance to shift as much as 20% or more during subsequent processing steps. Consequently, annealing or "bake" cycles generally are required to adjust the sheet resistance of deposited NiCr layers to desired "target" values. In contrast, the process of depositing SiCr is much more precisely controlled, because the SiCr does not react with oxygen or other ambient gases and therefore maintains a nearly constant sheet resistance during subsequent wafer processing and chip packaging operations. Consequently, time-consuming, costly subsequent annealing cycles are not required for the purpose of adjusting the sheet resistance, and only a single annealing cycle is required for the purpose of achieving sheet resistance stability. Therefore, the overall cost of integrated circuits having SiCr thin film resistors is substantially less than that of integrated circuits having NiCr resistors.

Published UK patent application GB 224-0875A published Aug. 14, 1991 entitled "A Method for Forming a Thin Film Resistor on an IC Wafer" by William Allen Lane and Andrew David Bain, assigned to Analog Research and Developments Ltd. in Ireland, incorporated herein by reference, discloses use of a TiW layer 15, 18 between a contact area of a SiCr thin film resistor 4 and an aluminum metal conductor 9.

Referring to FIG 2, it has become conventional in the integrated circuit industry to provide a TiW "barrier" layer 13 between an aluminum metallization layer 14 and the contact area 12A of a SiCr thin film resistor 12. The TiW barrier layer 14 is provided mainly for the purpose of preventing a reaction between the aluminum and the silicon present in the SiCr. However, the diagram of FIG. 2 does not show a very thin, irregular oxide between the TiW barrier layer 14 and the SiCr thin Film resistive layer 12.

The noise problem to which the invention relates was discovered by using the test arrangement shown in FIG. 1 to first measure the noise in a conventional low-noise operational amplifier test circuit 2 having NiCr thin film resistors fabricated using a conventional NiCr process. The resulting measured current noise level was very low, only 19.1 Pico amperes peak-to-peak.

Next, the same test arrangement shown in FIG. 1 was used to measure the noise in another identical low-noise operational amplifier having its thin film resistors composed of SiCr instead of NiCr. The measured current noise level for SiCr thin film resistors was 50.3 picoamperes peak-to-peak, nearly 3 times higher than for NiCr resistors. The noise was observed as broadband noise in the 0.1 to 10 Hz range.

Thus, there is an unmet need for a way of manufacturing integrated circuits including SiCr thin film resistors which do not generate excessive noise.

There also is an unmet need for a low cost a way of manufacturing integrated circuits including SiCr thin film resistors which do not generate excessive noise.

SUMMARY OF THE INVENTION

It is an object of the invention to provide a way of manufacturing integrated circuits including SiCr thin film resistors which do not generate excessive noise.

It is another object of the invention to provide a low cost a way of manufacturing integrated circuits including SiCr thin film resistors which do not generate excessive noise.

Briefly described, and in accordance with one embodiment, the present invention provides a method of preventing contact noise in a SiCr thin film resistor includes performing in situ depositions of a SiCr layer and then a TiW layer on a substrate without breaking a vacuum between the depositions, to prevent formation of any discontinuous oxide between the SiCr layer and the TiW layer. The SiCr and TiW layers are patterned to form a predetermined SiCr thin film resistor pattern and a TiW resistor contact pattern on the SiCr thin film resistor, and a metallization layer is provided to contact the TiW forming the resistor contact pattern. In the described embodiment, a SiCr stabilization process is performed after the patterning of the metallization layer. The metallization includes aluminum or aluminum alloy. A passivation oxide is deposited on the wafer after the metallization layer is patterned.

In one embodiment, the invention provides a low noise SiCr thin film resistor including an SiCr layer and a TiW layer disposed on a contact area of the SiCr layer without any discontinuous oxide between the SiCr layer and the TiW layer sufficient to cause noise-producing current-path-shifting of current flowing through both the SiCr layer and the TiW layer.

In another embodiment, the invention provides a low noise SiCr thin film resistor made by the method of preventing contact noise by performing in situ depositions of a SiCr layer and then a TiW layer on a substrate without breaking a vacuum between the depositions, to prevent formation of any discontinuous oxide between the SiCr layer and the TiW layer, patterning the SiCr and TiW layers to form a predetermined SiCr thin film resistor pattern and a TiW resistor contact pattern on the SiCr thin film resistor, and depositing and patterning a metallization layer to contact the TiW forming the resistor contact pattern.

DETAILED DESCRIPTION OF THE PREFERRED EMBODIMENTS

The present invention provides a way to provide low cost manufacture of low-noise SiCr thin film resistors in integrated circuits.

It was concluded that the above mentioned high noise levels (50.3 Pico amperes peak-to-peak) for operational amplifier 2 (FIG. 1) fabricated with standard SiCr thin film resistors was probably not due to the conventionally manufactured transistors in the operational amplifier 2. It was therefore concluded that the high measured noise was most likely due to the SiCr thin-film resistors. The most probable cause of the higher noise was thought to be due to a contact resistance problem at the interface between the SiCr and TiW layers.

Figure 3:
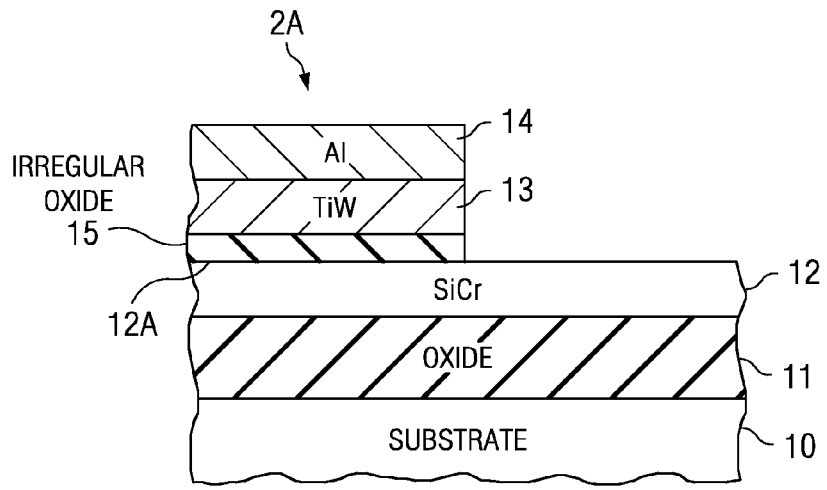
FIG. 3 is a section view similar to that shown in FIG. 2, further including a "hypothesized" thin irregular oxide layer between the SiCr layer and the TiW.

FIG. 3 shows a patterned aluminum layer 14 on a TiW barrier layer 13 formed over the contact area 12A of one end of a SiCr resistor 12 formed on a thick dielectric oxide 12 on integrated circuit substrate A thin "hypothetical" irregular oxide layer 15 is believed to be present on the contact area 12A of one end of SiCr thin film resistor 12, and is believed to interfere with good electrical contact between SiCr thin film resistor 12 and TiW barrier layer 13. What is meant by "hypothetical" is that the inventors have not actually seen the irregular oxide layer 15 by means of a microscope or the like. (For convenience, the opposite end of SiCr resistor 12, including an identical contact structure, is omitted from the drawings.).

Figure 4:
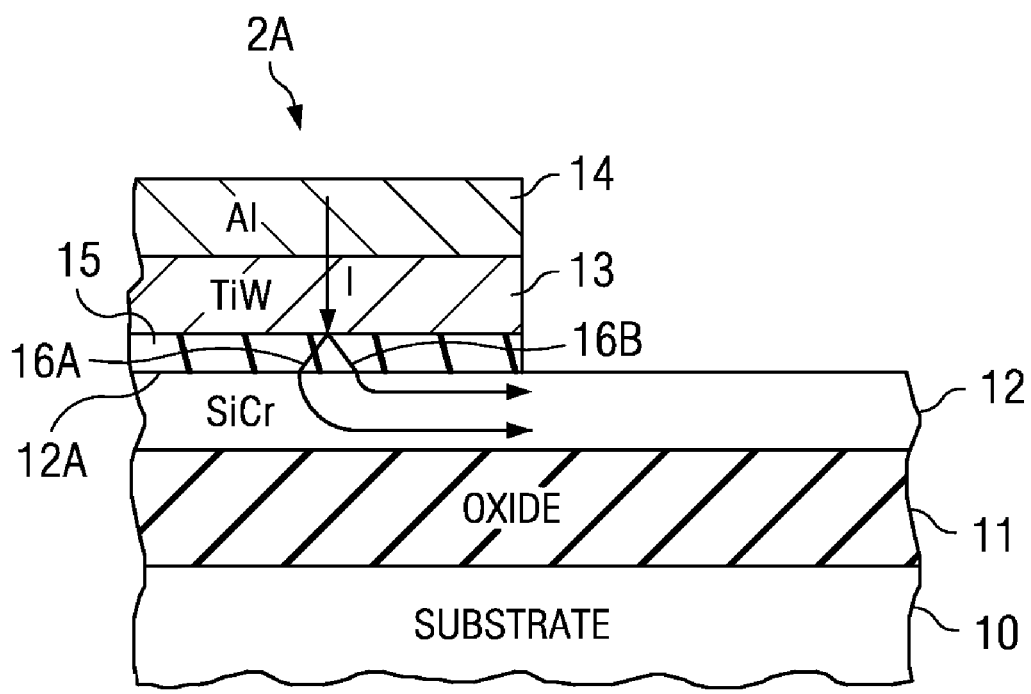
FIG. 4 shows the same end section view shown in FIG. 2 and further shows the variable path of a current I through the irregular oxide layer 15 and a resistor contacts area 12A causing generation of a noise current through the SiCr thin film resistor.

We believe that the irregular oxide layer 15 causes a highly discontinuous contact interface between the TiW barrier layer 13 and the SiCr contact area 12A. Referring to FIG. 4, a current I flows through aluminum layer 14 and TiW barrier 13 and through irregular oxide layer 15. However, we believe that the discontinuous, irregular properties of oxide layer 15 cause the path of the current I to be discontinuous through irregular oxide layer 15 and cause at least part of the current I to repeatedly shift between sub-paths such as a sub-path 16A and a sub-path 16B as it flows through irregular oxide layer 15 into the contact area 12A of SiCr thin-film resistor 12. Since the resistances through sub-paths 16A and 16B would be unequal, the repeated shifting of current I between sub-paths 16A and 16B causes abrupt changes in I which constitute a noise component of the current I passing through SiCr thin film resistor 12.

Figure 1:
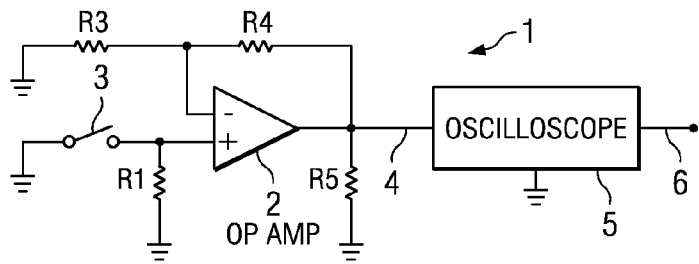
FIG. 1 is a schematic diagram of a conventional circuit for measuring noise in the output signal of an operational amplifier device under test (DUT) 2.
Figure 6:
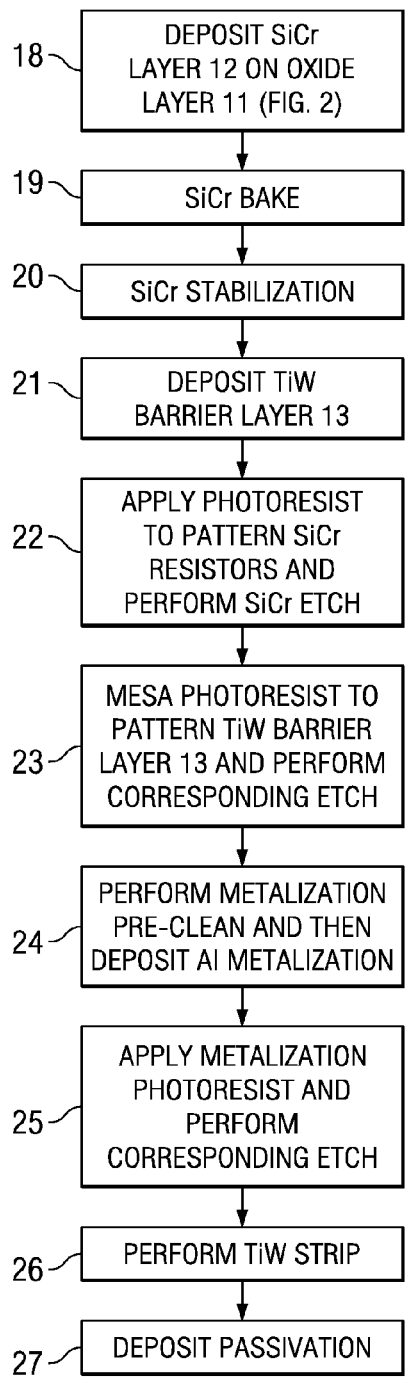
FIG. 6 is a flow chart useful in describing the closet prior art process.

FIG. 6 is a flow chart of a conventional process for making the of the above-mentioned SiCr thin-film resistors which were found to cause the operational amplifier 2 tested using the arrangement of FIG. 1 to have the above mentioned measured 50.3 Pico ampere peak-to-peak noise currents.

Figure 2:
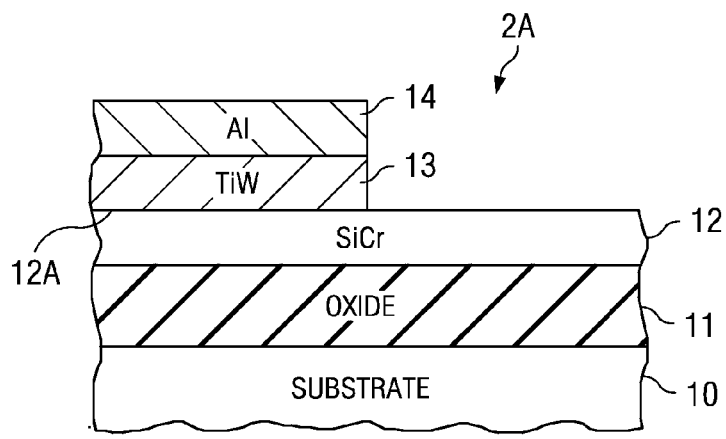
FIG. 2 is a section view of a conventional SiCr thin film resistor in an integrated circuit chip.

Referring to FIG. 6, beginning with the integrated circuit wafer 2A on which operational amplifier 2 is to be fabricated after the oxide layer 11 (FIG. 2) has been deposited, and as indicated in block 18, the first step of the conventional SiCr process is to deposit SiCr layer 12 on oxide layer 11, to a preferred thickness of approximately 200 Angstroms. However, the thickness of SiCr layer 12 can be in the range from approximately 50 to 250 Angstroms. This deposition can be in a PVD reactor (i.e., a "physical vapor deposition" reactor or sputtering machine") at a temperature of approximately 50 to 500 degrees Centigrade, although different sputtering gas, reactants, temperatures, and deposition times could be used.

Then, as indicated in block 19, a "SiCr bake" of the wafer 2A is performed, preferably in an oven in the presence of $N_2$ gas, at a temperature of approximately 150 to 300 degrees Centigrade for approximately 30-60 minutes. However, the parameters of the SiCr bake cycle 19 could be adjusted by those skilled in the art to achieve a particular desired effect. The purpose of the SiCr bake cycle 19 is to stabilize the resistances of the resistors.

As indicated in block 20, the next step is to perform a "SiCr stabilization" anneal cycle on the wafer 2A, the purpose of which is to further improve the resistor stability. The SiCr stabilization cycle preferably is performed in a diffusion furnace in the presence of nitrogen or air ambient, at a temperature of approximately 400 to 500 degrees Centigrade for approximately 30 to 60 minutes. However, the parameters of the SiCr stabilization cycle 20 are not critical and could be adjusted by those skilled in the art to achieve a particular desired effect. The effect of the first anneal cycle 19 is not completely understood, and it may be omitted from the process. The second anneal cycle 20 actually sets the electrical parameters.

As indicated in block 21, the next step is to deposit the TiW barrier layer 13 on SiCr layer 12, to a preferred thickness of approximately 250 Angstroms. However, the thickness of TiW barrier layer 13 can be in the range from approximately 200 to 2500 Angstroms. This deposition can be in a PVD reactor at a temperature of approximately 50 to 250 degrees Centigrade, although different reactors, reactant gases, temperatures, and deposition times could be used.

As indicated in block 22, the next step includes providing suitably patterned conventional photo resist (not shown in the drawings) on the wafer surface and etched in a conventional manner to define the SiCr resistors 12 from the previously deposited SiCr layer.

Next, as indicated in block 23, "mesa photo resist" is provided on the wafer surface and a corresponding etch is performed to define the pattern of the mesa layer 13 (i.e., the layer on which the SiCr resistor is formed).

Next, as indicated in block 24, a metallization pre-clean is performed on wafer 2A, and then aluminum metallization is deposited on the wafer surface, preferably to a thickness of approximately 11,000 Angstroms. The deposition may be performed in a PVD reactor at approximately 300-400 degrees Centigrade, although different reactors, reactant gas, and temperatures could be used.

Next, as indicated in block 25, a suitably patterned metallization photo resist layer is provided on the wafer surface and a corresponding etch is performed to define the desired aluminum interconnect metallization. Then, as indicated in block 26, a TiW strip operation is performed to remove TiW from all areas except between the resistor and metal contacts to prevent formation of a parasitic resistor in parallel with the SiCr resistor. As indicated in block 27, a passivation deposition then is provided on the wafer.

It should be emphasized that the general practice in making SiCr thin-film resistors in the integrated circuit industry is that SiCr layers deposited for manufacture of thin film resistors should be baked or annealed immediately after being deposited.

As mentioned above, the foregoing conventional process for making SiCr thin-film resistors was found to result in very high circuit noise. A number of unsuccessful experiments then were performed in attempts to modify the foregoing conventional process to produce SiCr thin-film resistors that generate very little noise. A solution to the noise problem was finally obtained by performing additional cleaning processes after the SiCr deposition and moving the stabilization process to after the metallization patterning. In one experiment, a sulfuric peroxide treatment of the wafer was performed after the above mentioned SiCr bake to treat the above mentioned irregular oxide 15 believed to have been grown on the SiCr layer during the SiCr bake cycle. It was hoped that eh use of a sulfuric peroxide reactant would cause the interface oxide 15 to be uniform. An SiCr stabilization step and several etching steps were added to remove the resulting uniform interface oxide 15 without affecting the SiCr layer, immediately prior to depositing the TiW layer. It was hoped that this would completely eliminate the interface oxide 15 and thereby eliminate the previously described abrupt current-path-switching believed to cause the high noise. However, when the resulting operational amplifier 2 was tested using the arrangement of FIG. 1, the measured current noise was at an unacceptably high value of 34.7 Pico amperes peak-to-peak.

In another experiment, the process of the first experiment was modified to avoid performing the SiCr stabilization step after the sulfuric peroxide treatment, to thereby prevent it from possibly producing the irregular interface oxide 15. Instead, the SiCr stabilization step was performed after a passivation deposition that was performed after completion of the aluminum metallization. This experiment also included performing the same steps of blocks 21-25 shown in the flow chart of FIG. 6. The resulting operational amplifier 2 was tested using the arrangement of FIG. 1, and the measured current noise level was an acceptable 22.9 Pico amperes peak-to-peak, but there were unacceptable voids and billocks in the aluminum metallization 14.

In another experiment, the SiCr stabilization anneal step was performed between the metallization etch process and the passivation deposition, which eliminated the metal voids and billocks. When the resulting operational amplifier 2 was tested using the arrangement of FIG. 1, the measured current noise was 25.3 Pico amperes peak-to-peak. This was considered to be a fairly low level of noise production by the SiCr thin film resistors in the resulting operational amplifier 2 when tested in the arrangement of FIG. 1, but, the process was excessively costly because of the additional processing steps.

To overcome the additional processing costs of some of the cleaning steps, the SiCr deposition and the TiW deposition were performed in a "continuous" reactor without breaking the reactor vacuum, with no other steps being performed between the SiCr deposition and the TiW deposition, thereby forming an "in situ SiCr/TiW stack". This was found to prevent any irregular oxide layer 15 (FIG. 3) from being formed, and thereby eliminates what is believed to be the mechanism generating the previously described large noise currents. The flow chart of FIG. 7 illustrates the steps of an embodiment of the present invention.

Figure 7:
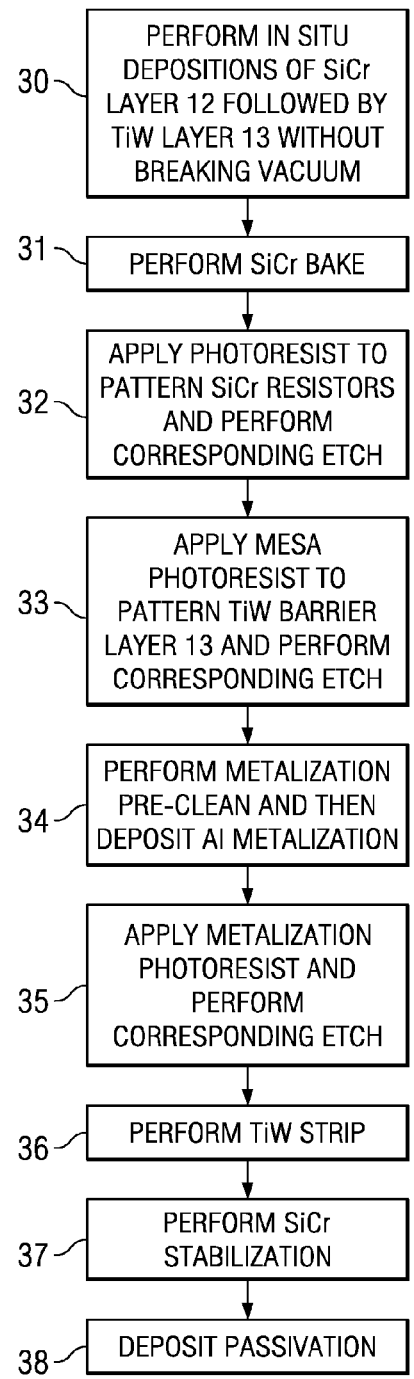
FIG. 7 is a flow chart useful in describing the invention.

Referring to FIG. 7, beginning with the wafer 2B (FIG. 5) after the oxide layer 11 (FIG. 2) has been deposited, and as indicated in block 30 of the flow chart, the first step of the preferred SiCr process of the present invention is to place the wafer 2B in a "continuous" reactor (not shown in the drawings) having two chambers, produce the usual vacuum therein, and then provide the appropriate reactant gas in the first chamber and deposit SiCr layer 12 on oxide layer 11, to a preferred thickness. Next, without breaking the vacuum, the wafer 2B is automatically moved from the first chamber into the second chamber without being exposed to any ambient that could cause any oxide growth on SiCr layer 12. Then, in the second chamber a TiW barrier layer 13 is deposited directly on SiCr layer 12. The foregoing "in situ" deposition of SiCr layer 12 and TiW later 13 can be performed in a PVD reactor.

Referring to block 31, a SiCr bake cycle (similar or identical to that referred to in block 19 of FIG. 6) is performed.

As indicated in block 32, in the next step conventional, suitably patterned photo resist is provided on the wafer surface and etched in a conventional manner to define the SiCr resistors 12 from the previously deposited SiCr layer. This step can be similar to or identical to the step in block 22 of FIG. 6.

Next, as indicated in block 33, "mesa photo resist" is provided on the wafer surface and a corresponding etch is performed to define the pattern of the desired TiW barrier layer 13.

Then, as indicated in block 34, a metallization pre-cleaning is performed, and then aluminum metallization is deposited on the wafer surface.

Next, as indicated in block 35, a suitably patterned conventional metallization photo resist layer is provided on the wafer surface and a corresponding etch is performed to define the desired aluminum interconnect metallization. The steps indicated in block 35 of FIG. 7 can be similar to or identical to the step indicated in block 25 of FIG. 6.

As indicated in block 36, a "TiW strip" process similar to the one referred to in block 26 of FIG. 6 is performed. Then, as indicated in block 37, and contrary to the conventional practice in the industry, the next step is to perform a SiCr stabilization cycle on the wafer. (The reason the SiCr stabilization ordinarily is performed immediately after the SiCr deposition as shown in FIG. 6 is to prevent subsequent processing from affecting the sheet resistance of the SiCr layer.) The SiCr stabilization steps indicated in block 36 of FIG. 7 can be similar to or identical to the process steps indicated in block 25 of FIG. 6.

Finally, as indicated in block 38 of FIG. 7, a conventional passivation oxide layer (not shown in the drawings) is deposited on the wafer. When the resulting operational amplifier 2 was tested using the arrangement of FIG. 1, the measured noise current was only 19.4 Pico amperes peak-to-peak, which was even lower than the noise level achieved by the standard NiCr process and was considered to be a very acceptable level.

Thus, in accordance with the present invention, it was discovered that high broadband noises in SiCr thin film integrated circuit resistors was caused by an irregular interface oxide between the SiCr layer and the TiW barrier. It was also discovered that providing a 100:1 HF dip of the wafer prior to deposition of the TiW deposition, followed by a stabilization anneal after the metal etching step helped the TiW getter the interface oxide and prevent the metal voids, but this added to the wafer processing costs.

Figure 5:
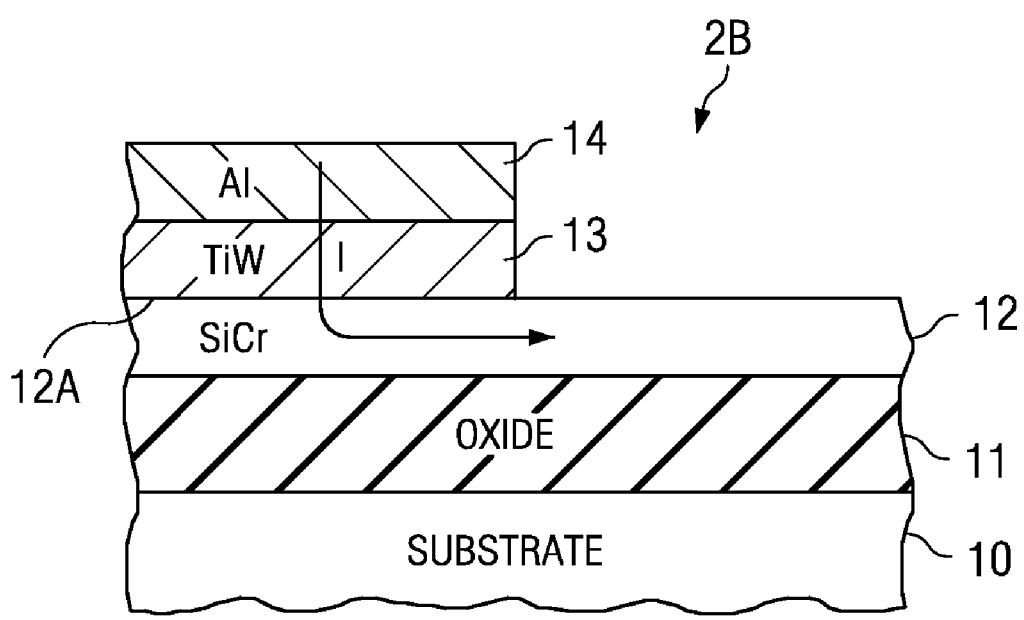
FIG. 5 shows an end section view of conventional SiCr thin film resistor in an integrated circuit chip according to the present invention, and illustrates a non-variable path of a current I through the resistor contact area 12A, resulting in substantial reduction or elimination of current noise.

Finally, it was found that in situ SiCr/TiW deposition eliminated the interface oxide growth, and that this eliminated the broadband noise current in the SiCr resistors and the consequent broadband current noise measured by means of the test circuit shown in FIG. 1. The described in situ SiCr/TiW process also eliminated multiple cleaning steps required in the earlier experiments, thereby reducing the integrated circuit processing time and wafer cost, and thereby provides an in situ "TiW—SiCr stack," as shown in FIG. 5 which is free of any noise-producing interface oxide 15 of the kind shown in FIGS. 3 and 4.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

What is claimed is:

1. A method of preventing contact noise in a SiCr thin film resistor, comprising:
   (a) performing in situ depositions of a SiCr layer and then a TiW layer on a substrate without breaking a vacuum between the depositions, to prevent formation of any discontinuous oxide between the SiCr layer and the TiW layer;
   (b) patterning the SiCr and TiW layers to form a predetermined SiCr thin film resistor pattern and a TiW resistor contact pattern on the SiCr thin film resistor; and
   (c) depositing and patterning a metallization layer to contact the TiW forming the resistor contact pattern.

2. The method of claim 1 including performing a SiCr stabilization process after the patterning of the metallization layer.

3. The method of claim 1 including performing a metallization pre-clean operation before depositing the metallization layer.

4. The method of claim 1 including performing a SiCr bake operation before patterning the SiCr layer.

5. The method of claim 1 wherein step (b) includes patterning the SiCr layer by applying photo resist to define a pattern of the SiCr resistor and performing an etch to pattern the SiCr resistor.

6. The method of claim 5 wherein step (b) includes patterning the TiW layer by applying photo resist to define the resistor contact pattern and performing an etch to produce the TiW resistor contact pattern.

7. The method of claim 1 wherein the metallization is aluminum metallization.

8. The method of claim 2 including performing a TiW strip process after the SiCr stabilization process.

9. The method of claim 1 including depositing passivation on the wafer after step (c).

10. The method of claim 1 including performing a SiCr bake operation before patterning the SiCr layer, performing a metallization pre-clean operation before depositing the metallization layer, and performing a SiCr stabilization process after the patterning of the metallization layer.

11. The method of claim 10 wherein the metallization is aluminum metallization, the method including performing a TiW strip process before the stabilization process, and performing a passivation deposition on the wafer after step (c).

* * * * *